United States Patent [19]

Wilmsmeyer

[11] 4,428,071
[45] Jan. 24, 1984

[54] INTEGRATED CIRCUIT HAVING NON-VOLATILE PROGRAMMABLE SEMICONDUCTOR MEMORIES

[75] Inventor: Klaus Wilmsmeyer, Denzlingen, Fed. Rep. of Germany

[73] Assignee: ITT Industries Inc., New York, N.Y.

[21] Appl. No.: 321,829

[22] Filed: Nov. 16, 1981

[30] Foreign Application Priority Data

Nov. 27, 1980 [DE] Fed. Rep. of Germany ....... 3044689

[51] Int. Cl.³ ............................................... G11C 7/00
[52] U.S. Cl. .................................... 365/226; 307/285; 307/297
[58] Field of Search ....................... 365/182, 229, 226; 307/285, 297

[56] References Cited

U.S. PATENT DOCUMENTS 4,368,524 1/1983 Nakamura et al. ................. 365/226

Primary Examiner—Terrell W. Fears

Attorney, Agent, or Firm—John T. O'Halloran; Alfred C. Hill

[57] ABSTRACT

A circuit arrangement is provided to supervise the supply voltage of the programming logic of a non-volatile integrated circuit comprising insulated-gate field-effect transistors whose threshold voltages are altered by the programming logic and whose gate electrodes are connected wordwise to word lines. The circuit arrangement is integrated into the integrated circuit and includes an integrated threshold switch connected to the programming voltage source and a reference voltage source having at least one, but preferably two zener diodes connected in series. The threshold switch in combination with supervision logic connects the word lines to the substrate voltage of the programming logic when the supply voltage is lost. An additional threshold switch coupled to the supervision logic, the reference voltage source and the programming voltage line connects the word lines to the substrate voltage of the programming logic when the programming voltage is lost.

25 Claims, 3 Drawing Figures

INTEGRATED CIRCUIT HAVING NON-VOLATILE PROGRAMMABLE SEMICONDUCTOR MEMORIES

BACKGROUND OF THE INVENTION

The present invention relates to programmable integrated circuits employing semiconductor memories in the form of insulated-gate storage transistors whose threshold voltages can be changed by injection of charge carriers into or out of a storage medium of the individual insulated-gate field-effect transistors and more particularly to an arrangement to present a faulty programming of individual storage transistors by an unintended displacement of the threshold voltage of individual storage transistors.

The present invention is based on the recognition that at least some of these faulty programmings are due to the fact that during the unintended or intended disconnection of the power supply, at the moment of the loss of this voltage, it is possible for unintended programming pulses to be triggered which destroy the information contained in the memory. This occurs above all when, as is the usual case with non-volatile memories, the voltage supply is provided by several sources.

The invention, therefore, is concerned with the problem of preventing as far as possible such unintentionally occuring programming pulses in an integrated circuit comprising non-volatile programmable semiconductor memories in the form of insulated-gate field-effect transistors whose threshold voltages, at least during the writing operation, can be changed with the aid of a momentarily applied writing pulse.

A review of the involved non-volatile programmable semiconductor memories can be found on pages 1039 to 1059 of "Proceedings of the IEEE", Vol. 64, No. 7 (July 1976). With these semiconductor memories, at least the writing is carried out by means of an electric pulse with the aid of which charge carriers tunnel through a sufficiently dimensioned insulating layer to a storage medium in the direct proximity of the channel region of an insulated-gate field-effect transistor, and are trapped in the storage medium. At present, integrated circuits employing nonvolatile programmable semiconductor memories are commercially available in the form of MNOS transistors. Relative thereto, reference is made to the printed publication "Siemens Forschungs- und Entwicklungsberichte", Vol. 4 (1975) No. 4, pp. 213 to 219. A further practical application of the invention is with insulated-gate field-effect transistors with storage media in the form of gate electrodes with a floating potential as known, for example, from "IEEE Transactions on Consumer Electronics", Vol. CE-26 (February 1980), pp 20 to 25.

The range of practical application of the invention also extends to integrated circuits employing semiconductor memories which are written electrically but can also be erased by ultraviolet radiation, as is known, for example, from "Electronics" of Mar. 13, 1980, pp. 115 to 121.

Integrated circuits to which the invention relates, at least for writing in the storage transistors, comprises a programming logic, mostly in a special substrate zone for writing optionally into each of the storage transistors a logic "one" or logic "zero" defined by the threshold voltage. For this purpose the gate electrodes of the storage transistors are connected wordwise to a word line.

SUMMARY OF THE INVENTION

Accordingly, an object of the present invention is to provide an integrated circuit with non-volatile programmable semiconductor memories in the form of insulated-gate storage transistors to prevent unintended programming of the individual storage transistors upon disconnecting the power supply from the integrated circuit.

A feature of the present invention is the provision of in an integrated circuit including non-volatile programmable semiconductor memories in the form of storage transistors having threshold voltages which can be altered by a momentarily applied writing pulse of a programming voltage provided by an integrated programming logic circuit coupled to a source of supply voltage which is lower than the programming voltage, a supervisory circuit to detect at least a loss of the supply voltage comprising: A first threshold switch integrated into the integrated circuit having its voltage supply terminal coupled to the programming voltage and another terminal coupled to a reference voltage source including at least one zener diode integrated into the integrated circuit having a reverse breakdown voltage available at an output point thereof; and logic circuitry coupled to the output of the first threshold switch and to word lines of the integrated circuit to connect the word lines to a substrate zone of the programming logic when the supply voltage is lost.

Basically, when neither a programming nor a reading operation is to be carried out, the word line or word lines are coupled to the substrate zone of the programming logic. This also applies to the case where no substrate zone of its own is provided for the programming logic, but this term is to be understood to cover an island-shaped area of one conductivity type produced, for example, by employing an insulating zone of the other conductivity type passing in a frame-shaped manner through an expitaxial layer of the one conductivity type deposited on to a substrate of the other conductivity type. In some cases it is necessary or desirable to supervise also the programming voltage Vp. For this purpose, in the integrated circuit employing non-volatile programmable semiconductor memories according to the present invention, there is integrated a further threshold switch whose voltage-supply terminal is coupled to the programming-voltage line and whose reference voltage is taken off the already existing reference source of the threshold switch supervising the supply voltage Vdd.

One particular feature of the invention resides in the use of integrated zener diodes for providing the reference voltage. The latter can be easily manufactured with the small dispersions of the zener voltages which are necessary in production, when the planar diffusion process which is required anyway for manufacturing the drain and source zones, is utilized for manufacturing the one zone of the zener diode or the one zone of the zener diodes. The other zone or zones are then diffused by employing oppositely doped impurities in the course of a further diffusion process which, as a rule, is required anyway for contacting the substrate zone of the integrated programming logic.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

In an integrated circuit according to the present invention, for supervising the supply voltage Vdd, there is basically integrated into the circuit at least one threshold switch whose voltage-supply terminal 1 is coupled to the programming voltage Vp, and the reference voltage U1 provided by a source of reference voltage I related to substrate potential containing an integrated zener diode breaking down in the reverse direction, or a series arrangement of several integrated zener diodes breaking down in the reverse direction. The output A1 of the threshold switch II acts in such a way, via a suitable supervisory logic, upon the word lines WL1 . . . WLn, that the word lines upon loss of the supply voltage Vdd are connected to the substrate zone or potential of the programming logic. According to the example of the embodiment shown in FIG. 1, the supervisory logic contains an inverter including the field-effect transistors T7 and T14, the output signal of which is applied to the one input E1 of a NAND gate G1. The output of the NAND gate G1 is applied to the gate electrodes of the transistors T14, T15 and T16 whose source-drain sections extend between the word lines WL1, WL2 and WL3 and the potential Vss of the substrate zone of the programming logic, so that the word lines can be connected to the substrate zone. To the other input E2 of the NAND gate G1 there is applied a signal which is capable of being taken off the programming logic, and which corresponds to the logic "one" during either the reading or writing operation.

A further protection against unintended programming is achieved by the use of a further integrated-gate field-effect switch transistor T17 whose source-drain section connects the substrate zone of the storage transistors to the substrate zone of the programming logic. The gate electrode of the further switch T17 is coupled to the output A4 of a further NAND gate G2 whose first input E3 is connected to the input E1 of the first NAND gate G1, and whose second input E4 has coupled thereto a logic "one" whenever, for example, during the erase operation, the substrate of the storage transistors is to receive a voltage.

Figure 1:
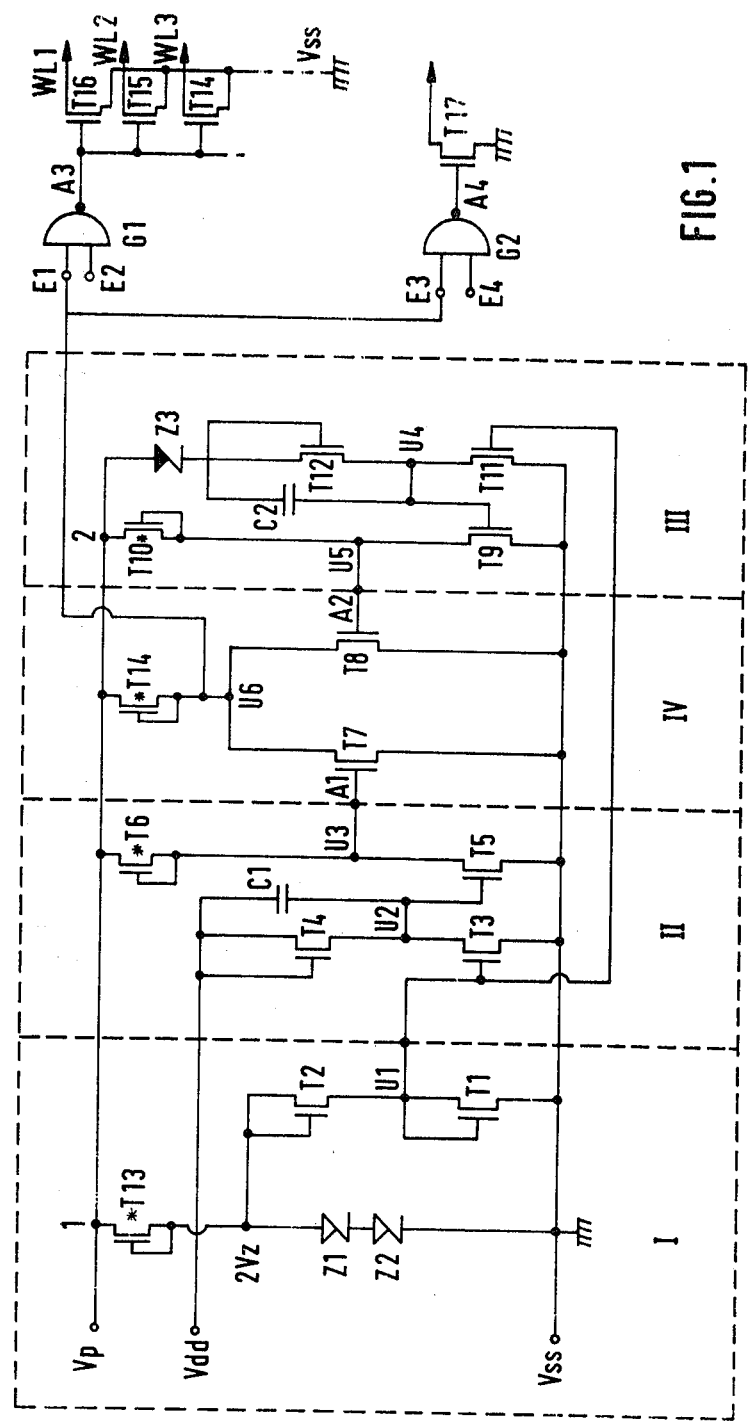
FIG. 1 is a circuit diagram of a supervisory circuit for supervising the programming voltage Vp as well as the supply voltage Vdd, for use with an integrated circuit according to the principles of the present invention.

The reference voltage U1 is taken off a zener diode or, as in the example of the embodiment shown in FIG. 1, at two integrated zener diodes Z1 and Z2 breaking down in the reverse direction, which form the reference source I in both cases with respect to substrate potential. Zener diodes Z1 and Z2 receive their voltage supply from the programming-voltage source Vp via the load transistor T13 which may be constructed as a field-effect transistor of the depletion type. The latter is connected to the programming-voltage line Vp.

The zener diodes Z1 and Z2 can be manufactured without an additional diffusion process by utilizing the diffusion processes for manufacturing the source and the drain zones (p+ diffusion in P-channel technique) and the diffusion processs for producing the island-connecting zones (N+ diffusion in P-channel technique). Accordingly, the zone 4 forming the pn junction 3 of the zener diodes—cf. FIGS. 2 and 3—or the zones of the one conductivity type forming the pn junctions of the zener diodes Z1 and Z2 have the same penetration depth and the same impurity distribution as the zones of the storage transistors. Embodiments of such zener diodes are partly shown in a cross-sectional view of FIGS. 2 and 3.

Figure 2:
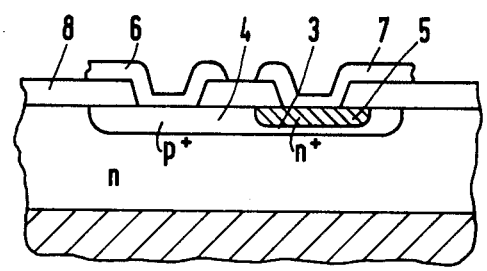
FIGS. 2 and 3 are cross-sectional views of an integrated circuit employed to assist in explaining the manufacture of a zener diode for use with the supervisory circuit of FIG. 1.
Figure 3:
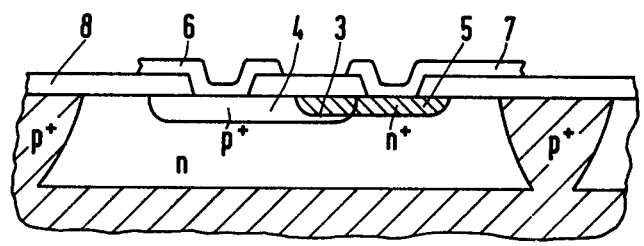

The one zone 4 is diffused in the course of the diffusion of source and drain zones of the storage transistors while the other zone 5 is manufactured in the course of the planar diffusion process for producing the island-contacting zones. The other zone 5 of the zener diode may be inserted into the one zone 4, as is illustrated in FIG. 2, and can just as well be produced overlappingly, as is shown in FIG. 3. To the zones 4 and 5 there are attached the contacting conductor leads 6 and 7 which, in accordance with the usual planar technology, extend outside the contacting windows on an insulating surface layer 8, preferably of silicon dioxide.

It has been found that the zener breakdown voltages $V_z$ of the thus manufactured diodes are rather constant, even when the doping of the other low-ohmic zone 5 varies slightly. By employing the usual diffusion processes with the customary surface concentrations, it is possible to achieve $V_z$ values of about 7.5 volts.

Owing to the relatively good constant value of the zener breakdown voltage $V_z$, the zener diodes may be used in connection with the load element, such as the load transistor T13, for serving as a source of reference voltage. The voltage value of approximately 15 volts as obtained from the series connection of two zener diodes Z1 and Z2 and of the load transistor T13 is stepped down in the voltage divider of the souce of reference voltage I, including the series arrangement of the transistor T1, lying on the substrate side, and the transistor T2. The reference voltage U1 is taken off the point connecting the two transistors T1 and T2. The reference voltage U1 is dependent upon the threshold voltage $U_T$ of these two transistors T1 and T2, and is always higher than $U_T$. In a preferred embodiment of the reference source I of the integrated circuit according to the present invention, the $\beta$-value of the transistor T1 is chosen to be substantially higher than that of the other transistor T2 of the series connection, i.e. $\beta 1$ is much greater than $\beta 2$, with the $\beta$-values being indicative of the mutual conductance factors, into which the ratio of channel width W to channel length L of the insulated-gate field-effect transistors with identical indices is introduced. In this particular case U1 only becomes slightly greater than $U_T$, for example, $U_T + \Delta V$. The drain zones of the two transistors T1 and T2 of the series connection are each connected to their gate electrodes as is shown in FIG. 1.

The actual threshold switch II includes a further series connection of two insulated-gate transistors T3 and T4 between the supply voltage Vdd and the substrate potential Vss. The drain electrode of the transistor T4 to which the supply voltage Vdd is connected is connected to its gate electrode, while the reference voltage U1 is coupled to the transistor T3 of the series connection as coupled to the substrate side.

If now the condition $\beta3/\beta4=\beta1/\beta2$ is substantially approximated, it will be easily seen that the following applies to Vdd=2 Vz $$U2=U1=U_T+\Delta V.$$

To Vdd voltages in the neighborhood of 2 Vz the following applies in a good approximation $$U2=U_T+\Delta V+Vdd-2Vz.$$

The capacitor C1 is to take care of a quick transmission of a Vdd variation to the gate electrode of the transistor T5 of the inverter stage of the threshold switch II, which includes the series connection of the two transistors T5 and T6. The transistor T6 having its drain electrode connected to the programming-voltage line Vp and its gate electrode connected to its source electrode is preferably a field-effect transistor of the depletion type, because in this way the inverter T5, T6 is given a very well defined switching voltage Us, so that U3 is smaller than $U_T$ when U2 is greater than Us, and U3 is greater than $U_T$ when U2 is smaller than Us. The β-values of the transistors T5 and T6 are chosen such that $Us=U_T+\Delta V$. When the aforementioned relationship of the β-values of the transistors T1, T2, T3 and T4 are simultaneously present, the Vdd voltage having a value independent of $U_T$ switches the output level of the inverter including T5 and T6 from "zero" to "one".

When the supply voltage Vdd drops below the supervisory level, namely, below 2 Vz in the example of embodiment, the voltage U3 is raised considerably above the threshold voltage $U_T$, and in this way the circuit point U6 via the inverter transistor T7 is approximately the potential Vss or the more the higher the β-value of the transistor T7 is chosen with respect to the β-value of the transistor T14 ($\beta7$ is much greater than $\beta14$). The transistor T14, just like the other transistors marked with an asterisk in FIG. 1, is preferably constructed as a transistor of the depletion type.

For supervising the programming voltage Vp which, as a DC voltage, is applied to the programming voltage line containing the circuit points 1 and 2, a further threshold switch III is integrated into the circuit according to the present invention, with the voltage supply terminal 2 thereof being coupled to the programming voltage Vp, and with the reference voltage U1 thereof being obtained from the reference source I via the threshold switch II for supervising the supply voltage Vdd. In the example of the embodiment shown in FIG. 1, the supervisory logic contains a NOR gate IV, the two inputs of which are connected to the outputs A1 and A2 of the two threshold switches I and III. Of course, instead of a NOR gate it is also possible to use an OR gate, in which case the subsequently following logic will have to be adapted accordingly.

For supervising the programming voltage Vp, the reference voltage U1 within the threshold switch III is coupled to the gate electrode of the transistor T11 arranged on the substrate side and forming part of a series arrangement of two insulated-gate field-effect transistors T11 and T12 which, via a further breakdown-operated zener diode Z3 is coupled to the programming voltage Vp. The drain electrode of the transistor T12 is connected to the further zener diode Z3 and to the gate electrode thereof.

In order to safeguard in the same way as with the threshold switch II, an independence of the variations of the threshold values $U_T$ occurring during production, the threshold switch III for supervising the programming voltage Vp, is constructed the same way as the threshold switch II. For this purpose the condition $$(\beta11/\beta12)=(\beta1/\beta2)$$

is to be approximated as far as possible. Like in the case of the threshold switch II, the point connecting the two transistors T11 and T12 to the voltage U4 is coupled to the gate electrode of a transistor T9 arranged on the substrate side of a series connection including the two transistors T10 and T9 between the programming voltage line and the substrate. When $\beta9$ and $\beta10$ are again chosen such that $Us=U_T+\Delta V$, then a switching threshold will result when the programming voltage Vp is reduced to 3 Vz. From the generally less frequently used logic gates which are operated by Vp, it has been found that they still operate reliably down to this voltage value (22.5 volts).

The output A2 of the threshold switch III is connected to the second input of the NOR gate IV.

Deviations from the above-mentioned special case $Us=U_T+\Delta V$ are admissible within certain limits either for allowing a more favorable construction or for fixing the switching level. The $U_T$-independence of the switching level, in that particular case, is only safeguarded by way of approximation which, in practice, however, is usually sufficient. Moreover, in the threshold switch III, for increasing the operating speed thereof, there is provided a capacitor C2 which is arranged between the source electrode and the drain electrode of the transistor T12 which is connected to the further zener diode Z3.

The integrated circuit according to the present invention as shown in FIG. 1 is suitable for use with a non-volatile programmable semiconductor memory operated from two independent voltage sources, namely from a programming voltage source of relatively high voltage and from a supply voltage source for the logic. For a semi-conductor memory manufactured in accordance with the P-channel MNOS technology, for example, a programming voltage Vp=−30 volts, and a supply voltage Vdd of −18 volts are customary. In the case of an integrated circuit employing a non-volatile programmable semiconductor memory which, in accordance with the described type of embodiment, is provided with a supervisory circuit according to FIG. 1, there is not only provided a protection against faulty programmings in the case of a losing supply voltage Vdd, but this protection is also provided in the case of a loss of the programming voltage Vp. In this case not only the word lines are lowered to the potential Vss of the substrate zone, but also the potential of the island containing the MNOS storage transistors is lowered to the island potential Vss of the programming logic.

While I have described above the principles of my invention in connecton with specific apparatus, it is to be clearly understood that this description is made only by way of example and not as a limitation to the scope of my invention as set forth in the objects thereof and in the accompanying claims.

I claim:

1. In an integrated circuit including non-volatile programmable semiconductor memories in the form of storage transistors having threshold voltages which can be altered by a momentarily applied writing pulse of a programming voltage provided by an integrated programming logic circuit coupled to a source of supply voltage which is lower than said programming voltage, a supervisory circuit to detect at least a loss of said supply voltage comprising:

a first threshold switch integrated into said integrated circuit having its voltage supply terminal coupled to said programming voltage and another terminal coupled to a reference voltage source including at least one zener diode integrated into said integrated circuit having a reverse breakdown voltage available at an output point thereof; and logic circuitry coupled to the output of said first threshold switch and to word lines of said integrated circuit to connect said word lines to a substrate zone of said programming logic when said supply voltage is lost.

2. A supervisory circuit according to claim 1, wherein said reference voltage source includes a plurality of series connected zener diodes each having said reverse breakdown voltage, the sum of said breakdown voltage being available at said output point.

3. A supervisory circuit according to claims 1 or 2, wherein said reference voltage source further includes a voltage divider connected between said substrate zone and said output point to provide said reference voltage, said voltage divider including a first insulated-gate field-effect transistor having its source electrode coupled to said substrate zone and its drain electrode coupled to its gate electrode and a second insulated-gate field-effect transistor having its source electrode coupled to the drain electrode of said first transistor and its drain electrode coupled to said output point and its gate electrode, said first transistor having a $\beta$-value $\beta 1$ substantially higher than a $\beta$-value $\beta 2$ of said second transistor, where $\beta$ is indicative of the mutual conductance constants of an insulated-gate field-effect transistor, said first threshold switch includes a third insulated-gate field-effect transistor having its source electrode coupled to said substrate zone and its gate electrode coupled to said drain electrode of said first transistor and a fourth insulated-gate field-effect transistor having its source electrode coupled to a drain electrode of said third transistor and its drain electrode coupled to said supply voltage source and its gate electrode, said third transistor having a $\beta$-value $\beta 3$ substantially higher than a $\beta$-value $\beta 4$ of said fourth transistor, respectively, and the condition $(\beta 3/\beta 4)=(\beta 1/\beta 2)$ is substantially approximated.

4. A supervisory circuit according to claim 3, further including a first capacitor coupled between said drain electrode and said source electrode of said fourth transistor to increase the operating speed of said first threshold switch.

5. A supervisory circuit according to claim 4, wherein said first threshold switch further includes a fifth insulated-gate field-effect transistor having its source electrode coupled to said substrate zone and its gate electrode coupled to said drain electrode of said third transistor and a sixth insulated-gate field-effect transistor having its source electrode coupled to a drain electrode of said fifth transistor and its drain electrode coupled to said programming voltage and its gate electrode, said drain electrode of said fifth transistor providing said output of said threshold switch.

6. A supervisory circuit according to claim 5, further including a second threshold switch to detect a loss of programming voltage integrated into said integrated circuit having its voltage supply terminal coupled to said programming voltage and another terminal coupled to said drain electrode of said first transistor to receive said reference voltage, and said logic circuitry includes a selected one of an OR gate and a NOR gate having two inputs, one of said two inputs being coupled to said output of said first threshold switch and the other of said two inputs being coupled to the output of said second threshold switch.

7. A supervisory circuit according to claim 6, wherein said second threshold switch includes a seventh insulated-gate field-effect transistor having its source electrode coupled to said substrate zone and its gate electrode coupled to said drain electrode of said first transistor, an eighth insulated-gate field-effect transistor having its source electrode coupled to said drain electrode of said seventh transistor and its gate electrode coupled to its drain electrode and an additional reverse breakdown-operated zener diode coupled between said drain electrode of said eighth transistor and said programming voltage, said seventh transistor having a $\beta$-value $\beta 7$, said eighth transistor having a $\beta$-value $\beta$ and the condition $(\beta 7/\beta 8)=(\beta 1/\beta 2)$ is substantially approximated.

8. A supervisory circuit according to claim 7, further including a second capacitor coupled between said drain electrode and said source electrode of said eighth transistor to increase the operating speed of said second threshold switch.

9. A supervisory circuit according to claim 8, wherein said second threshold switch further includes a ninth insulated-gate field-effect transistor having its source electrode coupled to said substrate zone and its gate electrode coupled to said drain electrode of said seventh transistor and a tenth insulated-gate field-effect transistor having its source electrode coupled to said drain electrode of said ninth transistor to provide said output of said second threshold switch and its drain electrode coupled to said programming voltage and its gate electrode.

10. A supervisory circuit according to claim 9, wherein said logic circuitry includes a NOR gate having an output, said one of said two inputs coupled to said drain electrode of said ninth transistor and said other of said two inputs coupled to said drain electrode of said fifth transistor, a first NAND gate having an output, a first input coupled to said output of said NOR gate and a second input coupled to a logic "one" during a reading or programming operation of said storage transistors and a logic "zero" at other times, and a plurality of insulated-gate field-effect transistor switches each connected to a different one of said word lines and to said output of said first NAND gate to connect said word lines to said substrate zone when a logic "zero" is present at said output of said first NAND gate.

11. A supervisory circuit according to claim 10, wherein
said logic circuitry further includes a second NAND gate having an output, a first input coupled to said output of NOR gate and a second input coupled to a logic "one" during a reading or programming operation of said storage transistors and a logic "zero" at other times, and an additional insulated-gate field-effect transistor switch coupled to said output of said second NAND gate and a substrate zone of said storage transistors to connect said substrate zone of said storage transistors to said substrate zone of said programming logic when a logic "zero" is present at said output of said second NAND gate.

12. A supervisory circuit according to claim 7 wherein
said second threshold switch further includes a ninth insulated-gate field-effect transistor having its source electrode coupled to said substrate zone and its gate electrode coupled to said drain electrode of said seventh transistor and a tenth insulated-gate field-effect transistor having its source electrode coupled to said drain electrode of said ninth transistor to provide said output of said second threshold switch and its drain electrode coupled to said programming voltage and its gate electrode.

13. A supervisory circuit according to claim 12, wherein
said logic circuitry includes a NOR gate having an output, said one of said two inputs coupled to said drain electrode of said ninth transistor and said other of said two inputs coupled to said drain electrode of said fifth transistor, a first NAND gate having an output, a first input coupled to said output of said NOR gate and a second input coupled to a logic "one" during a reading or programming operation of said storage transistors and a logic "zero" at other times, and a plurality of insulated-gate field-effect transistor switches each connected to a different one of said word lines and to said output of said first NAND gate to connect said word lines to said substrate zone when a logic "zero" is present at said output of said first NAND gate.

14. A supervisory circuit according to claim 13, wherein
said logic circuitry further includes a second NAND gate having an output, a first input coupled to said output of NOR gate and a second input coupled to a logic "one" during a reading or programming operation of said storage transistors and a logic "zero" at other times, and an additional insulated-gate field-effect transistor switch coupled to said output of said second NAND gate and a substrate zone of said storage transistors to connect said substrate zone of said storage transistors to said substrate zone of said programming logic when a logic "zero" is present at said output of said second NAND gate.

15. A supervisory circuit according to claim 3, wherein
said first threshold switch further includes a fifth insulated-gate field-effect transistor having its source electrode coupled to said substrate zone and its gate electrode coupled to said drain electrode of said third transistor and a sixth insulated-gate field-effect transistor having its source electrode coupled to a drain electrode of said fifth transistor and its drain electrode coupled to said programming voltage and its gate electrode, said drain electrode of said fifth transistor providing said output of said threshold switch.

16. A supervisory circuit according to claim 15 further including
a second threshold switch to detect a loss of programming voltage integrated into said integrated circuit having its voltage supply terminal coupled to said programming voltage and another terminal coupled to said drain electrode of said first transistor to receive said reference voltage, and
said logic circuitry includes a selected one of an OR gate and a NOR gate having two inputs, one of said two inputs being coupled to said output of said first threshold switch and the other of said two inputs being coupled to the output of said second threshold switch.

17. A supervisory circuit according to claim 16, wherein
said second threshold switch includes a seventh insulated-gate field-effect transistor having its source electrode coupled to said substrate zone and its gate electrode coupled to said drain electrode of said first transistor, an eighth insulated-gate field-effect transistor having its source electrode coupled to said drain electrode of said seventh transistor and its gate electrode coupled to its drain electrode and an additional reverse breakdown-operated zener diode coupled between said drain electrode of said eighth transistor and said programming voltage, said seventh transistor having a $\beta$-value $\beta 7$, said eighth transistor having a $\beta$-value $\beta 8$ and the condition $(\beta 7/\beta 8) = (\beta 1/\beta 2)$ is substantially approximated.

18. A supervisory circuit according to claim 17, further including
a second capacitor coupled between said drain electrode and said source electrode of said eighth transistor to increase the operating speed of said second threshold switch.

19. A supervisory circuit according to claim 18, wherein
said second threshold switch further includes a ninth insulated-gate field-effect transistor having its source electrode coupled to said substrate zone and its gate electrode coupled to said drain electrode of said seventh transistor and a tenth insulated-gate field-effect transistor having its source electrode coupled to said drain electrode of said ninth transistor to provide said output of said second threshold switch and its drain electrode coupled to said programming voltage and its gate electrode.

20. A supervisory circuit according to claim 19, wherein
said logic circuitry includes a NOR gate having an output, said one of said two inputs coupled to said drain electrode of said ninth transistor and said other of said two inputs coupled to said drain electrode of said fifth transistor, a first NAND gate having an output, a first input coupled to said output of said NOR gate and a second input coupled to a logic "one" during a reading or programming operation of said storage transistors and a logic "zero" at other times, and a plurality of insulated-gate field-effect transistor switches each connected to a different one of said word lines and to said output of said first NAND gate to connect said word lines to said substrate zone when a logic "zero" is present at said output of said first NAND gate.

21. A supervisory circuit according to claim 20, wherein said logic circuitry further includes a second NAND gate having an output, a first input coupled to said output of NOR gate and a second input coupled to a logic "one" during a reading or programming operation of said storage transistors and a logic "zero" at other times, and an additional insulated-gate field-effect transistor switch coupled to said output of said second NAND gate and a substrate zone of said storage transistors to connect said substrate zone of said storage transistors to said substrate zone of said programming logic when a logic "zero" is present at said output of said second NAND gate.

22. A supervisory circuit according to claim 17, wherein said second threshold switch further includes a ninth insulated-gate field-effect transistor having its source electrode coupled to said substrate zone and its gate electrode coupled to said drain electrode of said seventh transistor and a tenth insulated-gate field-effect transistor having its source electrode coupled to said drain electrode of said ninth transistor to provide said output of said second threshold switch and its drain electrode coupled to said programming voltage and its gate electrode.

23. A supervisory circuit according to claim 22, wherein said logic circuitry includes a NOR gate having an output, said one of said two inputs coupled to said drain electrode of said ninth transistor and said other of said two inputs coupled to said drain electrode of said fifth transistor, a first NAND gate having an output, a first input coupled to said output of said NOR gate and a second input coupled to a logic "one" during a reading or programming operation of said storage transistors and a logic "zero" at other times, and a plurality of insulated-gate field-effect transistor switches each connected to a different one of said word lines and to said output of said first NAND gate to connect said word lines to said substrate zone when a logic "zero" is present at said output of said first NAND gate.

24. A supervisory circuit according to claim 23, wherein said logic circuitry further includes a second NAND gate having an output, a first input coupled to said output of NOR gate and a second input coupled to a logic "one" during a reading or programming operation of said storage transistors and a logic "zero" at other times, and an additional insulated-gate field-effect transistor switch coupled to said output of said secohd NAND gate and a substrate zone of said storage transistors to connect said substrate zone of said storage transistors to said substrate zone of said programming logic when a logic "zero" is present at said output of said second NAND gate.

25. A supervisory circuit according to claims 1 or 2, further including a second threshold switch to detect a loss of programming voltage integrated into said integrated circuit having its voltage supply terminal coupled to said programming voltage and another terminal coupled to said drain electrode of said first transistor to receive said reference voltage, and said logic circuitry includes a selected one of an OR gate and a NOR gate having two inputs, one of said two inputs being coupled to said output of said first threshold switch and the other of said two inputs being coupled to the output of said second threshold switch.

* * * * *